(12) United States Patent
Young

(10) Patent No.: US 7,859,189 B2
(45) Date of Patent: Dec. 28, 2010

(54) ELECTROLUMINESCENT DISPLAY HAVING A DRIVE TRANSISTOR CONTROLLED BY A LIGHT SENSITIVE DEVICE AND A LIGHT BLOCKING STRUCTURE TO PREVENT CROSS TALK

(75) Inventor: Nigel D. Young, Redhill (GB)

(73) Assignee: Koninkijke Philips Electronics N.V., Eindhoven (NL)

( * ) Notice: Subject to any disclaimer, the term of this patent is extended or adjusted under 35 U.S.C. 154(b) by 1130 days.

(21) Appl. No.: 10/599,081

(22) PCT Filed: Mar. 22, 2005

(86) PCT No.: PCT/IB2005/050975

§ 371 (c)(1),
(2), (4) Date: Sep. 19, 2006

(87) PCT Pub. No.: WO2005/093700

PCT Pub. Date: Oct. 6, 2005

(65) Prior Publication Data

US 2007/0188085 A1      Aug. 16, 2007

(30) Foreign Application Priority Data

Mar. 24, 2004  (GB)  ................... 0406540.5

(51) Int. Cl.
*H01L 51/50*      (2006.01)
*H01L 51/52*      (2006.01)
(52) U.S. Cl. ...................... 313/507; 313/506
(58) Field of Classification Search .............. None
See application file for complete search history.

(56) References Cited

U.S. PATENT DOCUMENTS 6,392,617 B1 *  5/2002  Gleason ....................... 345/82

FOREIGN PATENT DOCUMENTS

| EP | 1096466 A | 5/2001 |
|---|---|---|
| WO | 0120591 A | 3/2001 |
| WO | 0199191 A | 12/2001 |
| WO | 03038798 A | 5/2003 |
| WO | 2004019123 A | 3/2004 |
| WO | 2004088627 A | 10/2004 |

* cited by examiner

*Primary Examiner*—Karabi Guharay
*Assistant Examiner*—Britt D Hanley

(57) ABSTRACT

An active matrix display device has pixels each with a light-sensitive device (84) for optical feedback functions. Each pixel has a light blocking structure (100) formed from the thin film layers of the display substrate in the proximity of the light-sensitive device (84) and substantially at the level of an input surface of the light sensitive device. This structure prevents the passage of light (g) to the light sensitive device from a substantially lateral direction.

24 Claims, 9 Drawing Sheets

ELECTROLUMINESCENT DISPLAY HAVING A DRIVE TRANSISTOR CONTROLLED BY A LIGHT SENSITIVE DEVICE AND A LIGHT BLOCKING STRUCTURE TO PREVENT CROSS TALK

This invention relates to electroluminescent display devices, particularly active matrix display devices having an array of pixels comprising light-emitting electroluminescent display elements and thin film transistors. More particularly, but not exclusively, the invention is concerned with an active matrix electroluminescent display device whose pixels include light sensing elements which are responsive to light emitted by the display elements and used in the control of energisation of the display elements.

Matrix display devices employing electroluminescent, light-emitting, display elements are well known. The display elements commonly comprise organic thin film electroluminescent elements, (OLEDs), including polymer materials (PLEDs), or else light emitting diodes (LEDs). The term LED used below is intended to cover all of these possibilities. These materials typically comprise one or more layers of a semiconducting conjugated polymer sandwiched between a pair of electrodes, one of which is transparent and the other of which is of a material suitable for injecting holes or electrons into the polymer layer.

The display elements in such display devices are current driven and a conventional, analogue, drive scheme involves supplying a controllable current to the display element. Typically a current source transistor is provided as part of the pixel configuration, with the gate voltage supplied to the current source transistor determining the current through the electroluminescent (EL) display element. A storage capacitor holds the gate voltage after the addressing phase. An example of such a pixel circuit is described in EP-A-0717446.

Each pixel thus comprises the EL display element and associated driver circuitry. The driver circuitry has an address transistor which is turned on by a row address pulse on a row conductor. When the address transistor is turned on, a data voltage on a column conductor can pass to the remainder of the pixel. In particular, the address transistor supplies the column conductor voltage to the current source, comprising the drive transistor and the storage capacitor connected to the gate of the drive transistor. The column, data, voltage is provided to the gate of the drive transistor and the gate is held at this voltage by the storage capacitor even after the row address pulse has ended. The drive transistor in this circuit is implemented as a p-channel TFT, (Thin Film Transistor) so that the storage capacitor holds the gate-source voltage fixed. This results in a fixed source-drain current through the transistor, which therefore provides the desired current source operation of the pixel. The brightness of the EL display element is approximately proportional to the current flowing through it.

In the above basic pixel circuit, differential ageing, or degradation, of the LED material, leading to a reduction in the brightness level of a pixel for a given drive current, can give rise to variations in image quality across a display. A display element that has been used extensively will be much dimmer than a display element that has been used rarely. Also, display non-uniformity problems can arise due to the variability in the characteristics of the drive transistors, particularly the threshold voltage level.

Improved voltage-addressed pixel circuits which can compensate for the ageing of the LED material and variation in transistor characteristics have been proposed. These include a light sensing element which is responsive to the light output of the display element and acts to leak stored charge on the storage capacitor in response to the light output so as to control the integrated light output of the display element during the drive period which follows the initial addressing of the pixel. Examples of this type of pixel configuration are described in detail in WO 01/20591 and EP 1 096 466. In an example embodiment, a photodiode in the pixel discharges the gate voltage stored on the storage capacitor and the EL display element ceases to emit when the gate voltage on the drive transistor reaches the threshold voltage, at which time the storage capacitor stops discharging. The rate at which charge is leaked from the photodiode is a function of the display element output, so that the photodiode serves as a light-sensitive feedback device.

The optical feedback arrangement enables compensation for initial non-uniformity between TFTs and display elements, as well as changes in these non-uniformities over time. The light output from a display element is independent of the EL display element efficiency and ageing compensation is thereby provided. Such a technique has been shown to be effective in achieving a high quality display which suffers less from non-uniformities over a period of time. However, this method requires a high instantaneous peak brightness level to achieve adequate average brightness from a pixel in a frame time and this is not beneficial to the operation of the display as the LED material is likely to age more rapidly as a result.

In an alternative approach, the optical feedback system is used to change the duty cycle with which the display element is operated. The display element is driven to a fixed brightness, and the optical feedback is used to trigger a transistor switch which turns off the drive transistor rapidly. This avoids the need for high instantaneous brightness levels, but introduces additional complexity to the pixel.

The use of optical feedback systems is considered as an effective way of overcoming differential ageing of the LED display elements.

A path of light must be provided between the LED display element and the photo-sensitive device. One problem which arises is that any stray light which is not absorbed by the photo-sensitive device can be captured by the photosensitive device of a different pixel. The substrate can act as a light guide which increases this undesirable cross talk effect.

According to a first aspect of the invention, there is provided an active matrix display device comprising an array of display pixels, each pixel comprising:

a current-driven light emitting display element comprising an area of light emitting material sandwiched between electrodes; and a drive transistor circuit for driving a current through the display element, the drive transistor circuit comprising a thin film circuit formed on a substrate, the thin film circuit defining a drive transistor and a light-sensitive device for detecting the brightness of the display element, the light-sensitive device having an input surface, wherein the drive transistor is controlled in response to the light-sensitive device output and wherein each pixel further comprises a light blocking structure formed from the thin film layers in the proximity of the light-sensitive device and substantially at the level of the input surface for preventing the passage of light to the light-sensitive device from a substantially lateral direction.

This aspect of the invention uses an additional structure at level of the input to the light-sensitive device, and this provides an effective way of blocking light from below (i.e. from the substrate) which can otherwise follow a path to the light-sensitive device, causing cross talk.

The light blocking structure may for example comprise a ring surrounding the light-sensitive device.

The light blocking structure can be formed from one or more of the thin film layers defining the light-sensitive device. In this way, no additional layers are required to define the light-sensitive device, and preferably no additionally patterning steps are also required.

The light blocking structure can be substantially planar, and can thus simply comprise an area of one or more of the thin film layers. Alternatively, the light blocking structure can comprise a side wall extending downwardly from the level of the input surface. This provides further blocking of light from very shallow angles (i.e. laterally with and with very small vertical component).

The light blocking structure may comprise first and second light blocking elements, the first light blocking element being provided at the level of the input surface, and the second light blocking element being provided above the level of the input surface. The first light blocking element is the one described above which provides blocking of light from below, and the second light blocking element provides blocking of light directed towards the light-sensitive device laterally and from above.

The second light blocking element can be formed from a metal layer which defines the source and drain of the drive transistor. This means that both light blocking elements can be formed from existing layers within the structure.

The light-sensitive device is preferably formed beneath the light emitting display element.

The invention can be used in bottom emission displays, in which the electrodes comprise a top reflective electrode and a bottom substantially transparent electrode.

The invention can also be used in top emission displays, in which the electrodes comprise a top substantially transparent electrode and a bottom electrode which is at least partially reflective. In top emission displays, a path needs to be provided through the bottom electrode to the underlying light-sensitive device. This may be through an aperture to allow or the bottom electrode may be semitransparent.

In another implementation, the light blocking structure can comprise an air cavity layer formed on top of the input surface of the light-sensitive device. An air cavity layer provides a light blocking function by providing reflection of all light away from the light-sensitive device other than light having a narrow range of incident angles. The light blocking structure may then further comprise an air cavity layer formed beneath a bottom surface of the light-sensitive device.

The substrate can be a glass substrate, or for top emission structures a metal foil and insulating dielectric layer.

According to a second aspect of the invention, there is provided an active matrix display device comprising an array of display pixels, each pixel comprising:

a current-driven light emitting display element comprising an area of light emitting material sandwiched between electrodes; and a drive transistor circuit for driving a current through the display element comprising a drive transistor and a light-sensitive device for detecting the brightness of the display element, wherein the drive transistor is controlled in response to the light-sensitive device output, wherein the electrodes comprise a top substantially transparent electrode and a bottom electrode which is at least partially reflective, and wherein a side of the substrate opposite the thin film circuitry is arranged to disturb reflection of light at the lower surface of the substrate.

This aspect of the invention provides a top emission structure, in which the bottom surface of the disturbs refection, so that a long pipelined path of total internal reflection within the substrate is prevented.

The side of the substrate opposite the thin film circuitry can be arranged to absorb light, for example by making the surface matt black, and/or the side of the substrate opposite the thin film circuitry can be arranged to scatter light.

In all aspects, the light-dependent device preferably comprises a photodiode, for example a PIN or NIP diode stack or a Schottky diode.

Examples of the invention will now be described in detail with reference to the accompanying drawings, in which.

The same reference numbers are used throughout the Figures to denote the same or similar parts.

Figure 1:
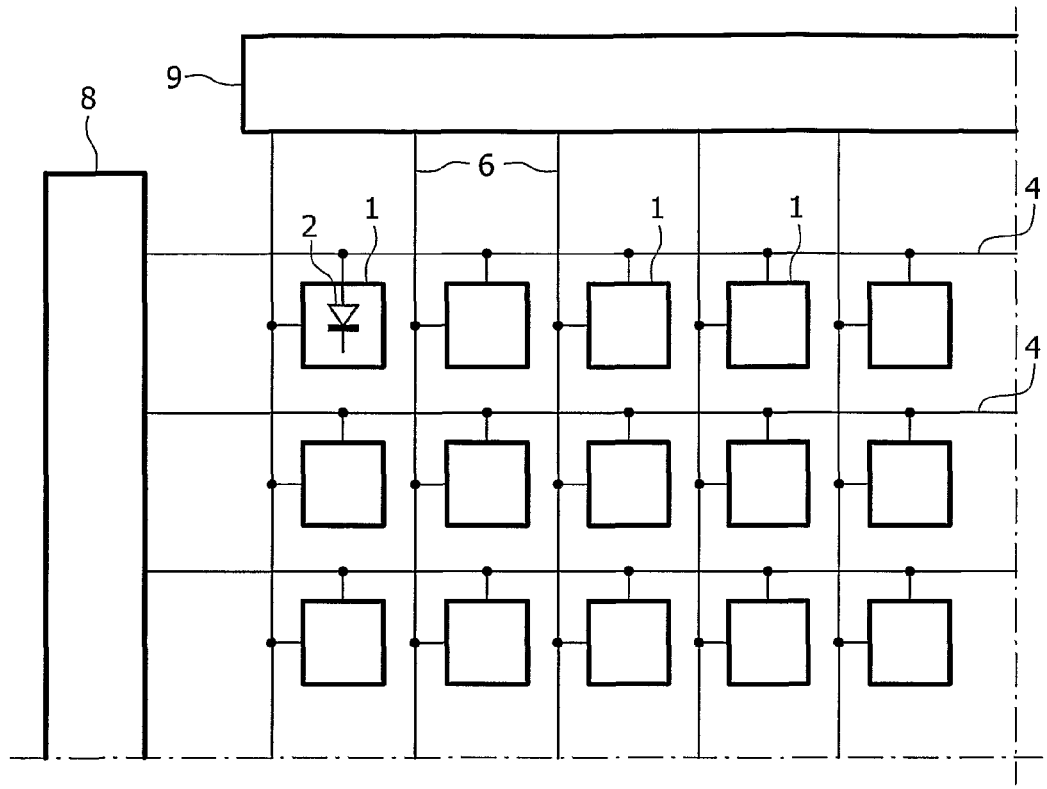
FIG. 1 is a simplified schematic diagram of an embodiment of active matrix EL display device.

FIG. 1 shows a known active matrix electroluminescent display device. The display device comprises a panel having a row and column matrix array of regularly-spaced pixels, denoted by the blocks 1 and comprising electroluminescent display elements 2 together with associated switching means, located at the intersections between crossing sets of row (selection) and column (data) address conductors 4 and 6. Only a few pixels are shown in the Figure for simplicity. In practice there may be several hundred rows and columns of pixels. The pixels 1 are addressed via the sets of row and column address conductors by a peripheral drive circuit comprising a row, scanning, driver circuit 8 and a column, data, driver circuit 9 connected to the ends of the respective sets of conductors.

The electroluminescent display element 2 comprises an organic light emitting diode, represented here as a diode element (LED) and comprising a pair of electrodes between which one or more active layers of organic electroluminescent material is sandwiched. The display elements of the array are carried together with the associated active matrix circuitry on one side of an insulating support. Either the cathodes or the anodes of the display elements are formed of transparent conductive material. The support is of transparent material such as glass and the electrodes of the display elements 2 closest to the substrate may consist of a transparent conductive material such as ITO so that light generated by the electroluminescent layer is transmitted through these electrodes and the support so as to be visible to a viewer at the other side of the support.

Figure 2:
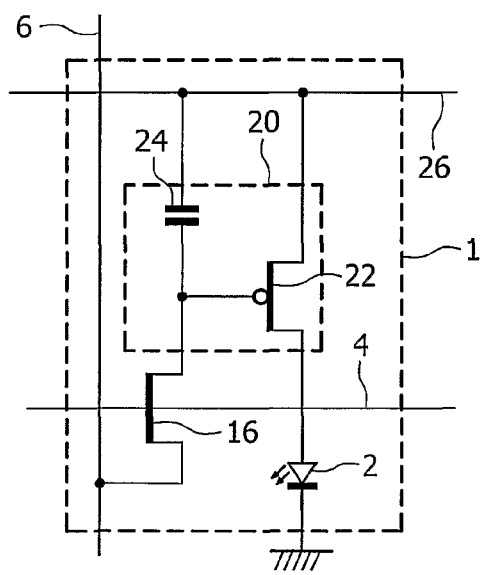
FIG. 2 illustrates a known form of pixel circuit.

FIG. 2 shows in simplified schematic form the most basic pixel and drive circuitry arrangement for providing voltage-addressed operation. Each pixel 1 comprises the EL display element 2 and associated driver circuitry. The driver circuitry has an address transistor 16 which is turned on by a row address pulse on the row conductor 4. When the address transistor 16 is turned on, a voltage on the column conductor 6 can pass to the remainder of the pixel. In particular, the address transistor 16 supplies the column conductor voltage to a current source 20, which comprises a drive transistor 22 and a storage capacitor 24. The column voltage is provided to the gate of the drive transistor 22, and the gate is held at this voltage by the storage capacitor 24 even after the row address pulse has ended.

The drive transistor 22 in this circuit is implemented as a p-type TFT, so that the storage capacitor 24 holds the gate-source voltage fixed. This results in a fixed source-drain current through the transistor, which therefore provides the desired current source operation of the pixel.

In the above basic pixel circuit, for circuits based on polysilicon, there are variations in the threshold voltage of the transistors due to the statistical distribution of the polysilicon grains in the channel of the transistors. Polysilicon transistors are, however, fairly stable under current and voltage stress, so that the threshold voltages remain substantially constant.

The variation in threshold voltage is small in amorphous silicon transistors, at least over short ranges over the substrate, but the threshold voltage is very sensitive to voltage stress. Application of the high voltages above threshold needed for the drive transistor causes large changes in threshold voltage, which changes are dependent on the information content of the displayed image. There will therefore be a large difference in the threshold voltage of an amorphous silicon transistor that is always on compared with one that is not. This differential ageing is a serious problem in LED displays driven with amorphous silicon transistors.

In addition to variations in transistor characteristics there is also differential ageing in the LED itself. This is due to a reduction in the efficiency of the light emitting material after current stressing. In most cases, the more current and charge passed through an LED, the lower the efficiency.

Figure 3:
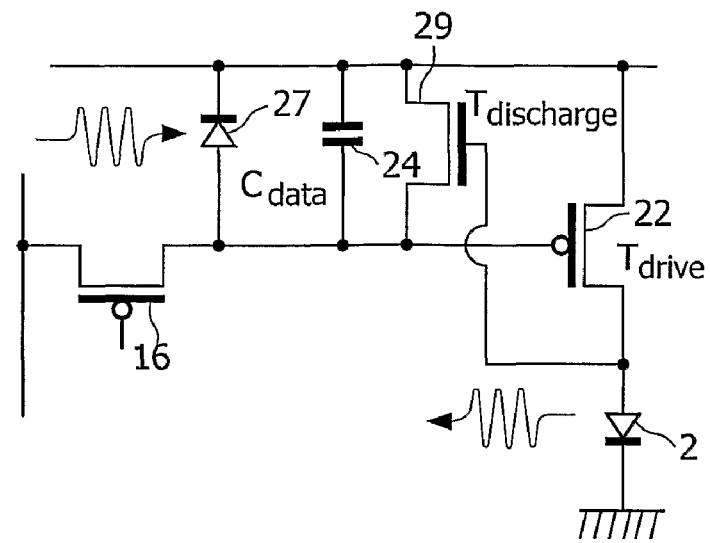
FIG. 3 shows a first known optical feedback pixel design.
Figure 4:
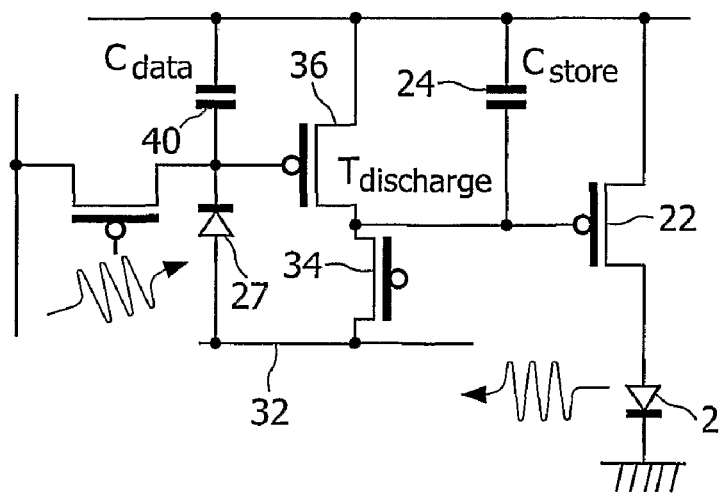
FIG. 4 shows a second known optical feedback pixel design.

FIGS. 3 and 4 show examples of pixel layout with optical feedback to provide ageing compensation.

In the pixel circuit of FIG. 3, a photodiode 27 discharges the gate voltage stored on the capacitor 24 ($C_{data}$), causing the brightness to reduce. The display element 2 will no longer emit when the gate voltage on the drive transistor 22 ($T_{drive}$) reaches the threshold voltage, and the storage capacitor 24 will then stop discharging. The rate at which charge is leaked from the photodiode 27 is a function of the display element output, so that the photodiode 27 functions as a light-sensitive feedback device. Once the drive transistor 22 has switched off, the display element anode voltage reduces causing the discharge transistor 29 ($T_{discharge}$) to turn on, so that the remaining charge on the storage capacitor 24 is rapidly lost and the luminance is switched off.

As the capacitor holding the gate-source voltage is discharged, the drive current for the display element drops gradually. Thus, the brightness tails off. This gives rise to a lower average light intensity.

FIG. 4 shows a circuit which has been proposed by the applicant, and which has a constant light output and then switches off at a time dependent on the light output.

The gate-source voltage for the drive transistor 22 is again held on a storage capacitor 24 ($C_{store}$). However, in this circuit, this capacitor 24 is charged to a fixed voltage from a charging line 32, by means of a charging transistor 34. Thus, the drive transistor 22 is driven to a constant level which is independent of the data input to the pixel when the display element is to be illuminated. The brightness is controlled by varying the duty cycle, in particular by varying the time when the drive transistor is turned off.

The drive transistor 22 is turned off by means of a discharge transistor 36 which discharges the storage capacitor 24. When the discharge transistor 36 is turned on, the capacitor 24 is rapidly discharged and the drive transistor turned off.

The discharge transistor 36 is turned on when the gate voltage reaches a sufficient voltage. A photodiode 27 is illuminated by the display element 2 and again generates a photocurrent in dependence on the light output of the display element 2. This photocurrent charges a discharge capacitor 40 ($C_{data}$), and at a certain point in time, the voltage across the capacitor 40 will reach the threshold voltage of the discharge transistor 36 and thereby switch it on. This time will depend on the charge originally stored on the capacitor 40 and on the photocurrent, which in turn depends on the light output of the display element. The discharge capacitor initially stores a data voltage, so that both the initial data and the optical feedback influence the duty cycle of the circuit.

There are many alternative implementations of pixel circuit with optical feedback. FIGS. 3 and 4 show p-type implementations, and there are also n-type implementations, for example for amorphous silicon transistors.

Figure 5:
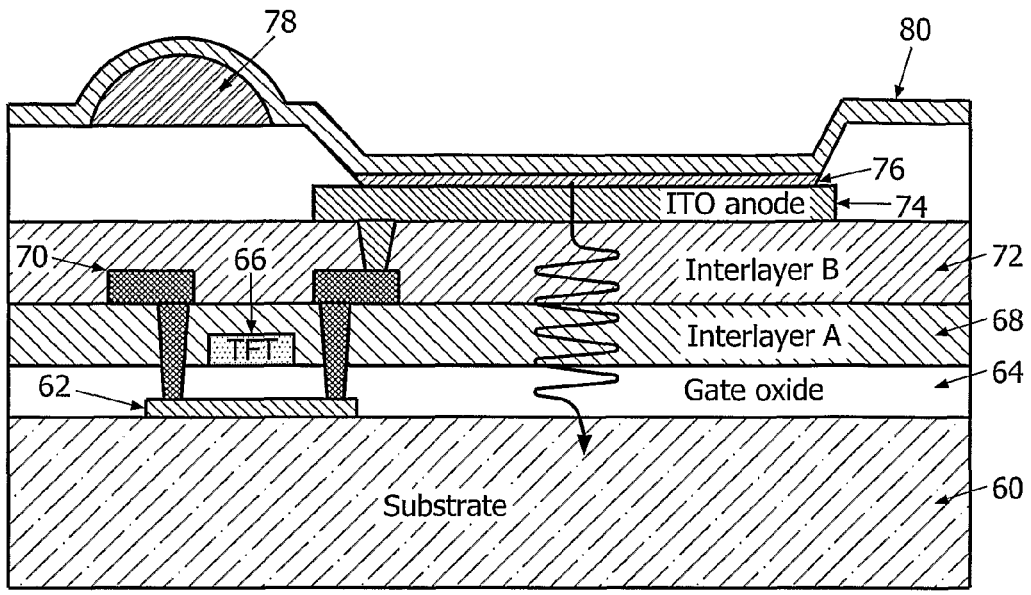
FIG. 5 shows a known structure of a bottom emitting display pixel.

FIG. 5 shows the known basic bottom emission structure including the active matrix.

The device comprises a substrate 60 over which the drive transistor semiconductor body 62 is deposited. A gate oxide dielectric layer 64 covers the semiconductor body, and a top gate electrode 66 is provided over the gate dielectric layer 64.

A first insulating layer 68 (typically silicon dioxide or silicon nitride) provides spacing between the gate electrode (which typically also forms row conductors) and the source and drain electrodes. These source and drain electrodes are defined by a metal layer 70 over the insulator layer 68, and the electrodes connect to the semiconductor body through vias as shown.

A second insulating layer 72 (again typically silicon dioxide or silicon nitride) provides spacing between the source and drain electrodes (which typically also form column conductors) and the LED anode. The LED anode 74 is provided over the second insulating layer 72.

In the case of a bottom emission display as shown in FIG. 5, this bottom anode needs to be at least partially transparent, and ITO is typically used.

The EL material 76 is formed in a well over the anode, and is preferably deposited by printing. Separate sub-pixels are formed for the three primary colours, and a print dam 78 assists in the accurate printing of the different EL materials.

The print dam 78 enables printing of separate pixels. This dam layer is generally made of an insulating polymer and has a height of several microns. A common cathode 80 is provided over the display, and this is reflective and at a common potential for all pixels (ground in FIG. 2).

Figure 6:
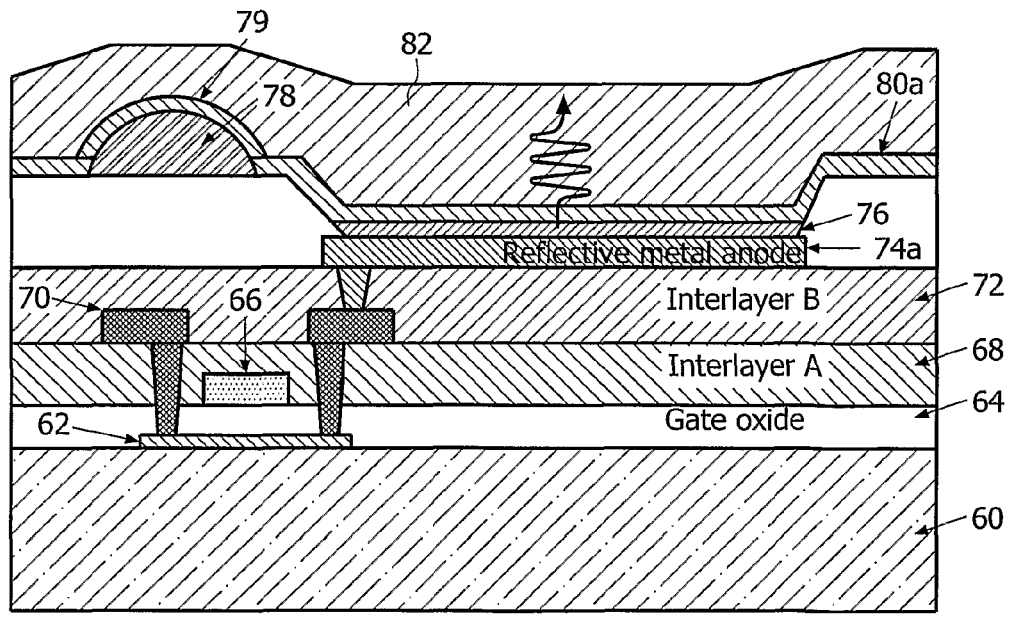
FIG. 6 shows a known structure of a top emitting display pixel.

FIG. 6 shows the basic known top emission structure including the active matrix. The structure is essentially the same as in FIG. 5, but the anode 74a is reflective and the cathode 80a is transmissive. The cathode may again be formed from ITO, but may have a thin metal or silicide coating between the ITO and polymer to control the barrier for electron injection. For example, this may be a thin layer of Barium. Protection and encapsulation layers 82 cover the display.

In a top-emission display, a transparent cathode is needed. The cathode does, however, have to be highly conductive, and at present highly conductive transparent metals are not readily available. Therefore the cathode of top-emission displays comprises a (semi-) transparent layer on top of the emissive pixel part and shunted with a lower resistance conducting (non-transparent) metal 79. By placing this highly conductive metal 79 on top of the dam 78 as shown, there is no loss in pixel aperture.

The anode metal must be a high work function metal, and it is known to provide a layer of ITO on top of a reflective metal to achieve a high work function into the LED stack.

Figure 7:
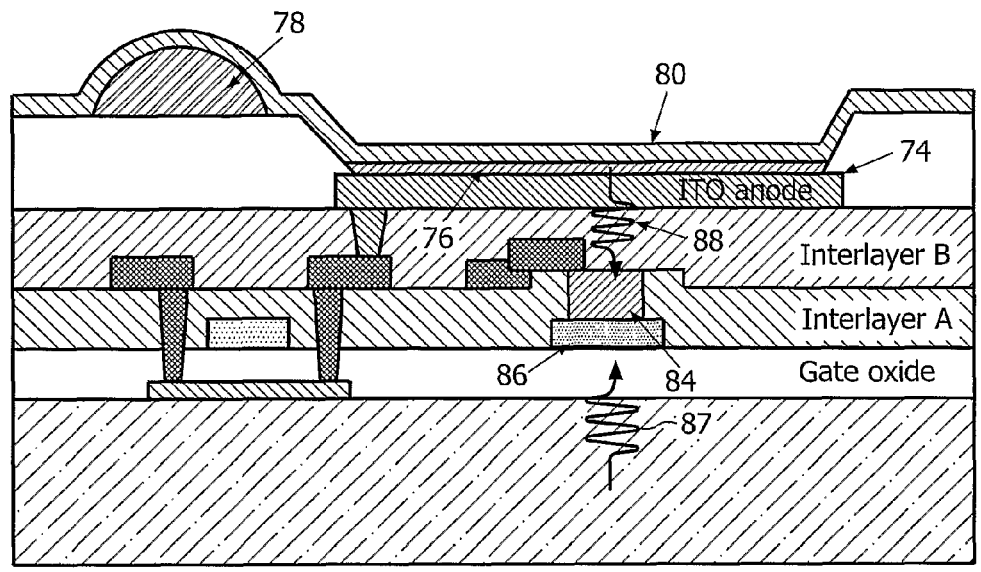
FIG. 7 shows a known structure of a bottom emitting display pixel with an integrated light sensitive element.

FIG. 7 shows the integration of an amorphous silicon PIN/NIP photo-diode 84 in a bottom emitting structure, in conventional manner. This type of photo-sensor is preferred as the amorphous silicon has high quantum efficiency for photo absorption.

This type of photo-sensor is ideal for bottom emission as the gate metal which is used to form the bottom electrode 86 of the diode stack screens the photo-sensor from external light 87. An open top aperture of the diode stack, shown schematically in FIG. 7, allows in light from the LED as shown by arrow 88.

The photodiode requires screening from both ambient light and stray LED light from neighbouring pixels. The glass substrate together with its dielectric 20, coatings provides a very good light pipe for light at shallow angles up to the critical angle for internal reflection. Consequently, significant amounts of light can reach photodiodes in pixels large distances away from the source of light.

FIGS. 8 to 17 show the display structure more schematically, and the top layers, which are not relevant to the invention, are removed, as well as the drive transistor structure. Thus, FIGS. 8 to 17 are intended to represent more schematically the structures shown in more detail in FIGS. 5 to 7.

Figure 8:
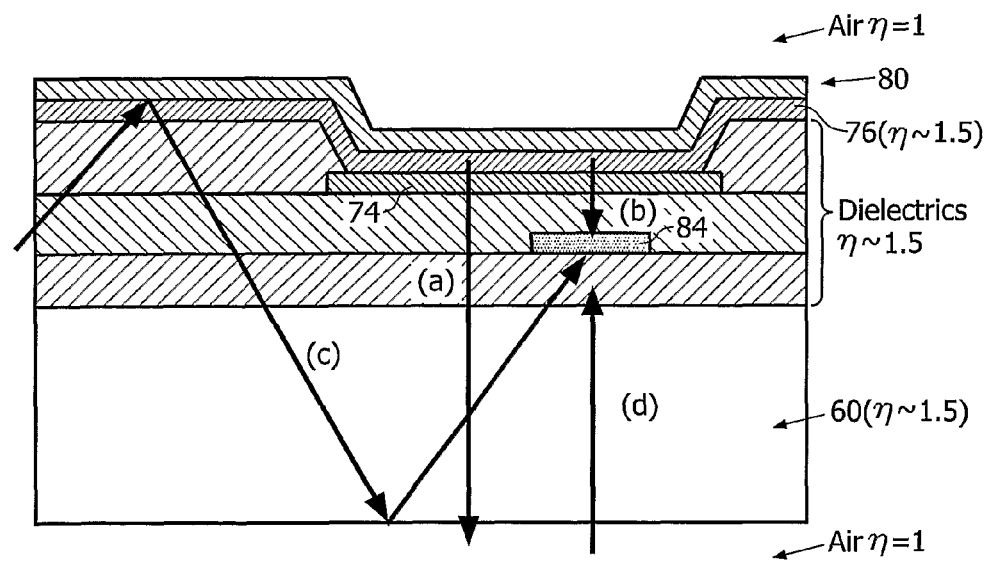
FIG. 8 is used to illustrate the problem addressed by the invention for a bottom emitting display pixel.

FIG. 8 is used to illustrate the problem associated with the known downward emitting LED structure of FIG. 7, and again shows the small photodetector 84 under part of the ITO pixel aperture. As shown in FIG. 8, the substrate glass and dielectrics have a refractive index close to 1.5, and so light entering at angles less than a critical angle (around 30-40° to the normal) becomes trapped, reflecting back and forwards between the metal cathode 80, and the air interface on bottom side of the substrate. This is shown by rays such as (c) in FIG. 8. Light at steeper angles (namely closer to normal to the substrate), rays (a), leave the display as required to give an image. Light of all angles, such as rays (b), can couple into the photodiode and ambient light of all angles can also couple into the photodiode, such as rays (d).

Figure 9:
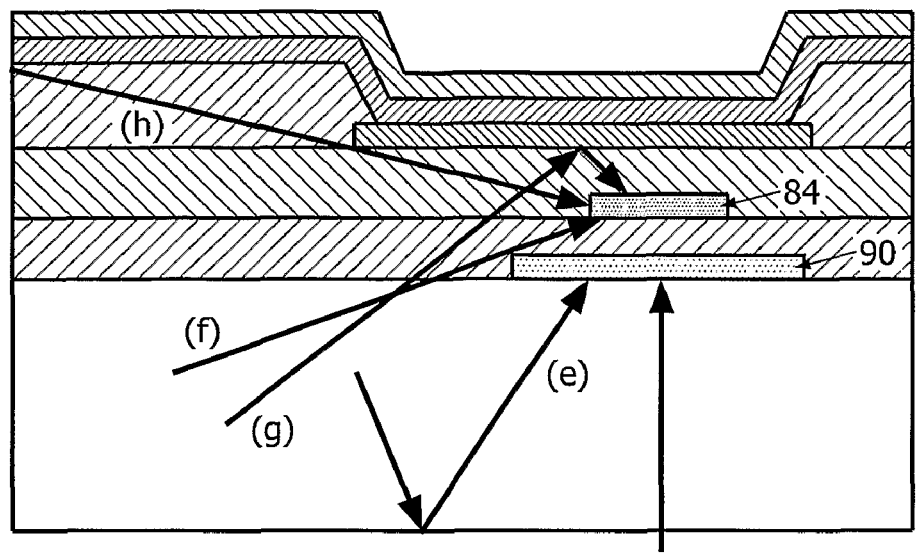
FIG. 9 shows a know way to address the problem explained with reference to FIG. 8.

FIG. 9 shows a known solution to shield from as much stray light as possible by using a bottom light shield 90. The photodiode 84 is spaced vertically from this shield by a dielectric of thickness at least 0.5 micron, and consequently very shallow angle light such as shown by rays (f), (g) and (h) can still enter the device. Clearly, the overlap of the shield can be extended to cut down the angle of light getting to the diode. However, extending this overlap consumes aperture, and it is not practical to shield light at angles of around 0-10° to the substrate.

The invention provides a light blocking structure formed from the existing thin film layers and in the proximity of the light-sensitive device, in particular at the level of the input surface, for preventing the passage of light to the light-sensitive device from a substantially lateral direction. The light blocking structure can be formed around the photodiodes at various levels in the device stack to absorb or reflect this very shallow angle light. By "shallow" is meant close the plane of the substrate, i.e. laterally directed light.

Figure 10:
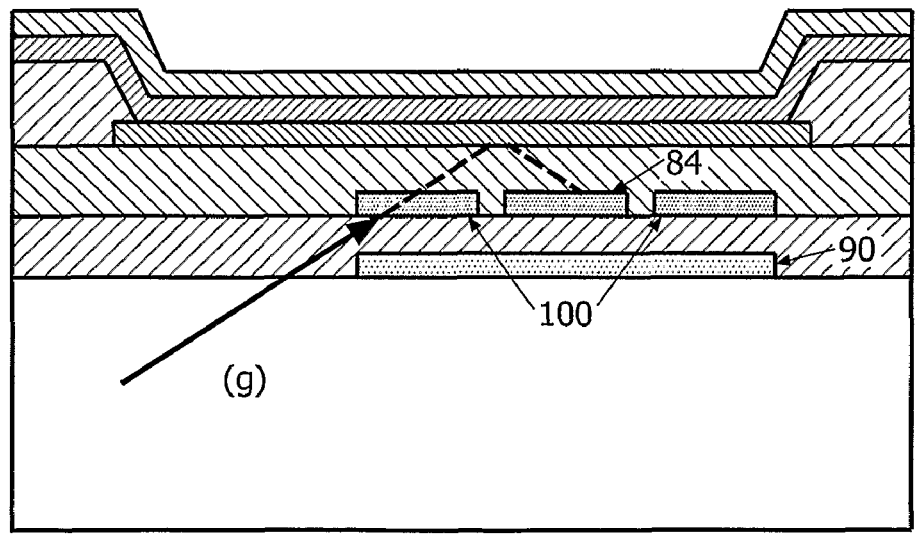
FIG. 10 shows a first bottom emitting display pixel structure of the invention.

FIG. 10 shows a first arrangement of light blocking arrangement of the invention. A ring of absorbing material 100 is placed around the diode 84 at the sane vertical level to protect from rays (g). The material of the ring 100 can be the photodiode material, so that no additional processing is required. The light blocking arrangement 100 is used in combination with the (conventional) light shield 90. In the example of FIG. 10, the light blocking structure is substantially planar, and can thus simply comprise an area of one or more of the thin film layers of the photodiode.

Figure 11:
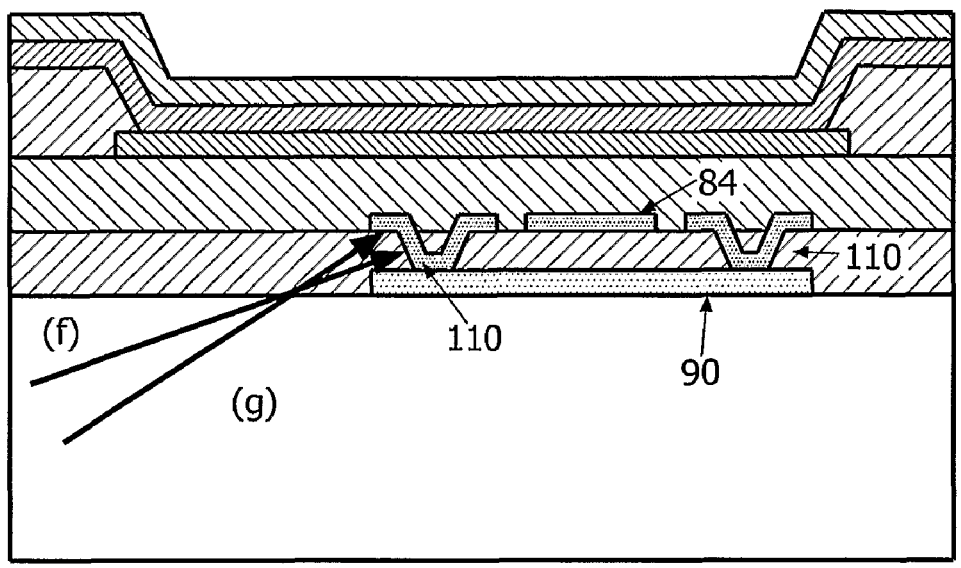
FIG. 11 shows a second bottom emitting display pixel structure of the invention.

FIG. 11 shows how extra processing can also prevent rays (f). In this case, vias are formed to the light shield 90, so that the light blocking structure has side walls 110 extending downwardly from the top of the photodiode stack. These side walls extend the full height of the photodiode stack.

Figure 12:
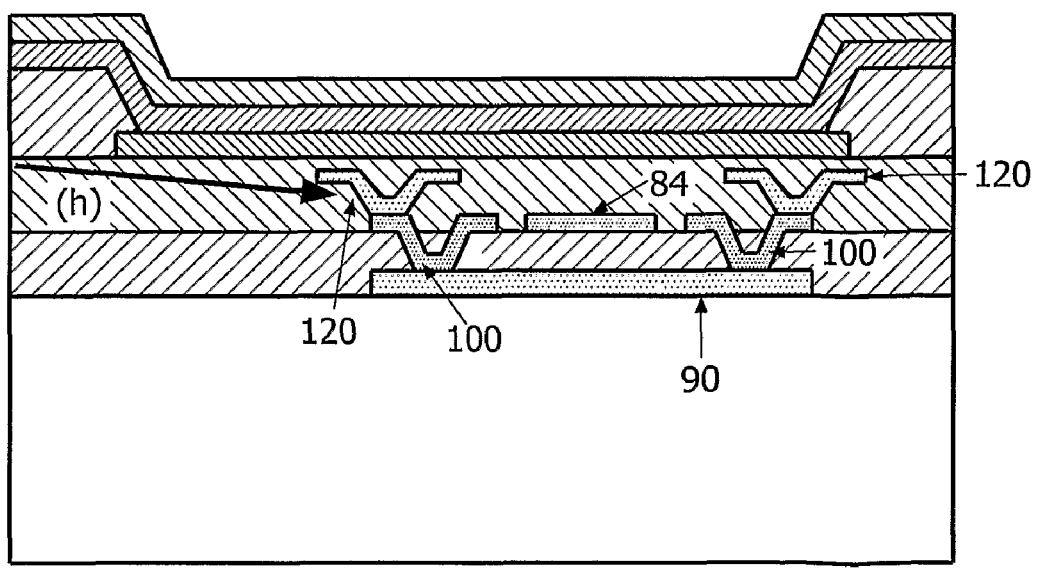
FIG. 12 shows a third bottom emitting display pixel structure of the invention.

FIG. 12 shows how other thin film layers can similarly be patterned at no extra processing cost to prevent rays from laterally above reaching the photodiode. FIG. 12 shows in particular an additional light blocking element formed from the metal layer 70 which defines the source and drain of the drive transistor. The light blocking structure then has first 100 and second 120 light blocking elements, the second light blocking element being provided above the level of the input surface of the photodiode. The second light blocking element 120 provides blocking of light directed towards the light-sensitive device laterally and from above as shown by rays (h).

The light blocking structure can still be formed from existing layers within the structure.

Figure 13:
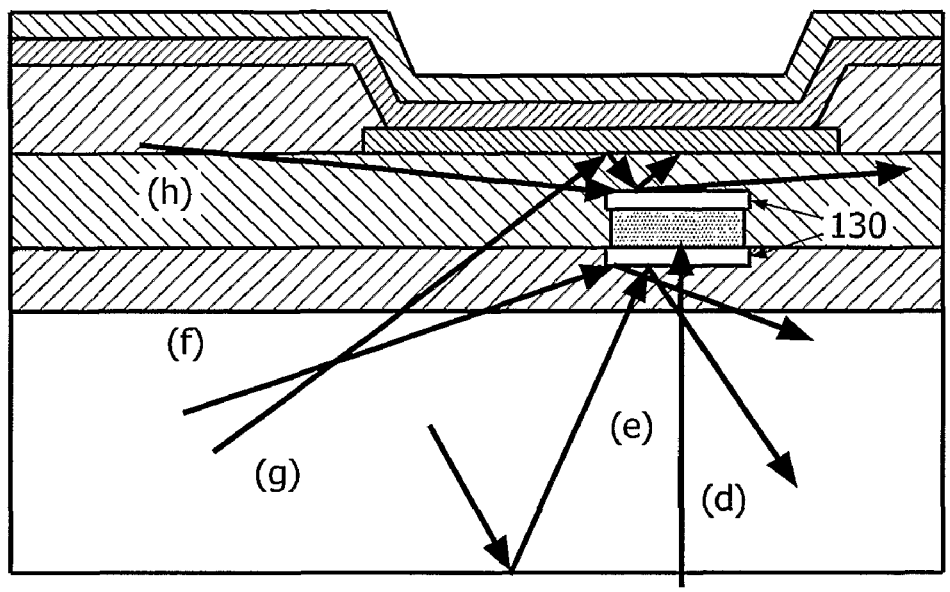
FIG. 13 shows a fourth bottom emitting display pixel structure of the invention.

FIG. 13 shows how the light blocking structure can be formed as air cavities 130, and these can provide protection from all shallow angle, with only large angle LED and ambient light (d) being detected. This could be combined with top or bottom light shields to produce a sensor which detects only pixel light, or only ambient light. These cavities 130 can be formed by under-etching metal or dielectric films placed in the stack. The cavities do not fully under-etch in other directions, so that the photodiodes remain anchored to the other layers and connecting electrodes. The diode semiconductor can be provided with a thin surface dielectric between it and the cavity, so that the surface is properly passivated. Cavities may effectively be produced without air gaps by using more complex dielectric stacks with high and low refractive indices.

The positioning of the sensor beneath the anode layer is clearly not appropriate for top emission structures as shown in FIG. 6, in which the anode is a reflective and opaque metal.

Figure 14:
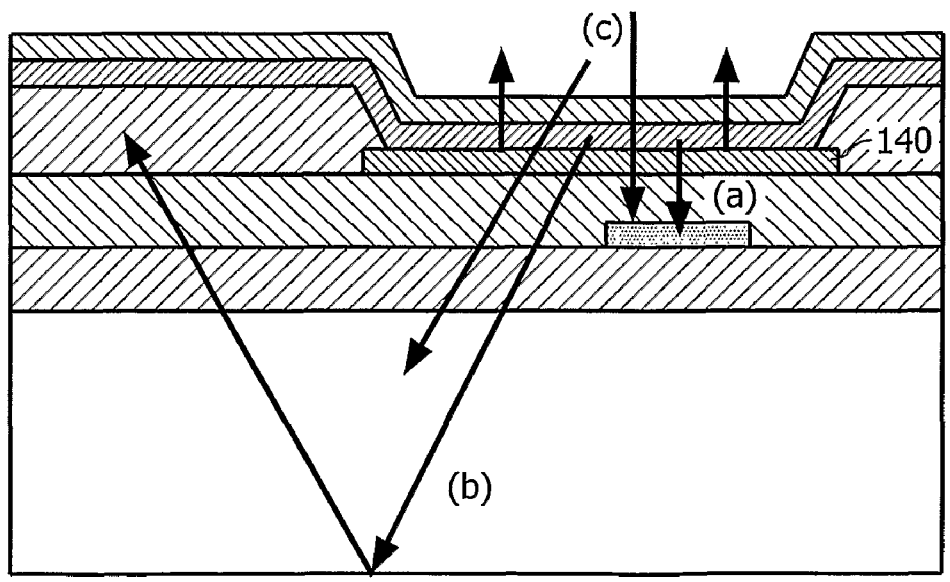
FIG. 14 shows a first way of providing a light path to the light-sensitive element in a top emitting display.

FIG. 14 shows a first way to provide a path of light to the photodiode for an upward emitting structure, in which a semi-transparent anode 140 is used. However, shallow angle light (light rays (b) from the LED and ambient light rays (c)) can again be piped in the glass and carried long distances.

Figure 15:
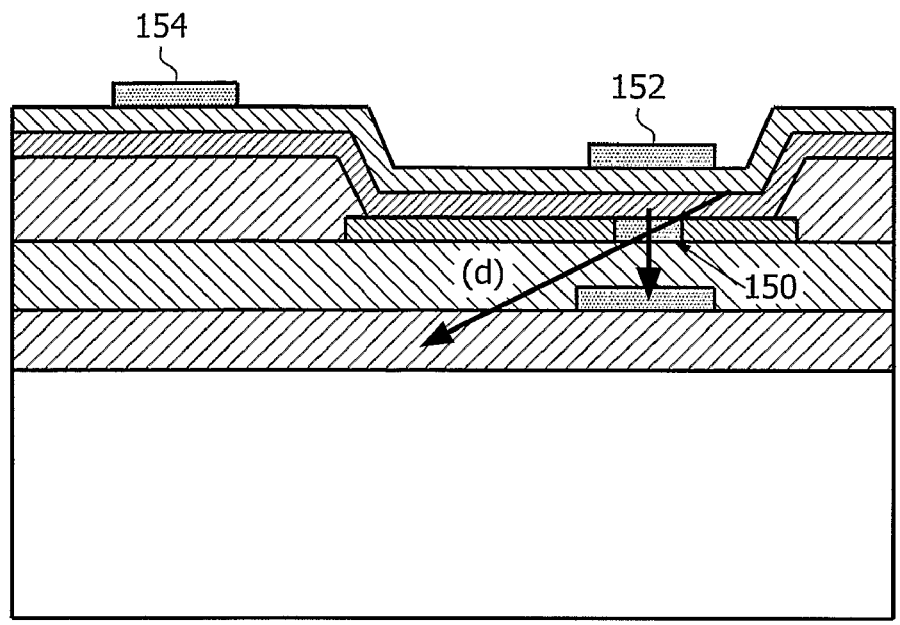
FIG. 15 shows a second way of providing a light path to the light-sensitive element in a top emitting display.

This can be reduced by having just a small transparent aperture over the diode as shown in FIG. 15. A top shield 152 is also shown in FIG. 15 for shielding ambient light, and if this is a metal, can also be used to back-up the cathode electrically as shown at 154, because the cathode is made from a relatively low conductivity transparent material, such as ITO. Light rays (d) can still enter the substrate and be piped within it.

Figure 16:
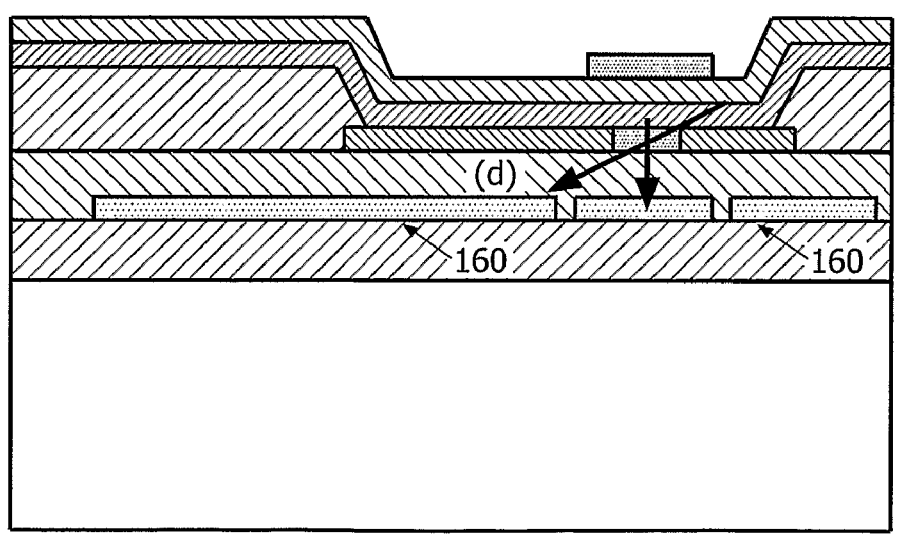
FIG. 16 shows a first top emitting display pixel structure of the invention.

FIG. 16 shows how the invention enables the diode material to be used to from a light blocking structure 160 again to absorb the remaining shallow angle light rays (d) in a similar fashion to the downward emission structures described above. Clearly, the other refinements and modifications above are equally applicable to top emitting structures.

In upward emitting displays, there is no need for transparent substrates. The substrates can be made on transparent substrates such as glass or plastic, but they may also be made on opaque substrates such as metal foil.

The use of a ring of diode material to define light blocking structures as shown in FIG. 16 can also be used to improve the arrangement of FIG. 14 in which a semi-transparent anode is used.

Figure 17:
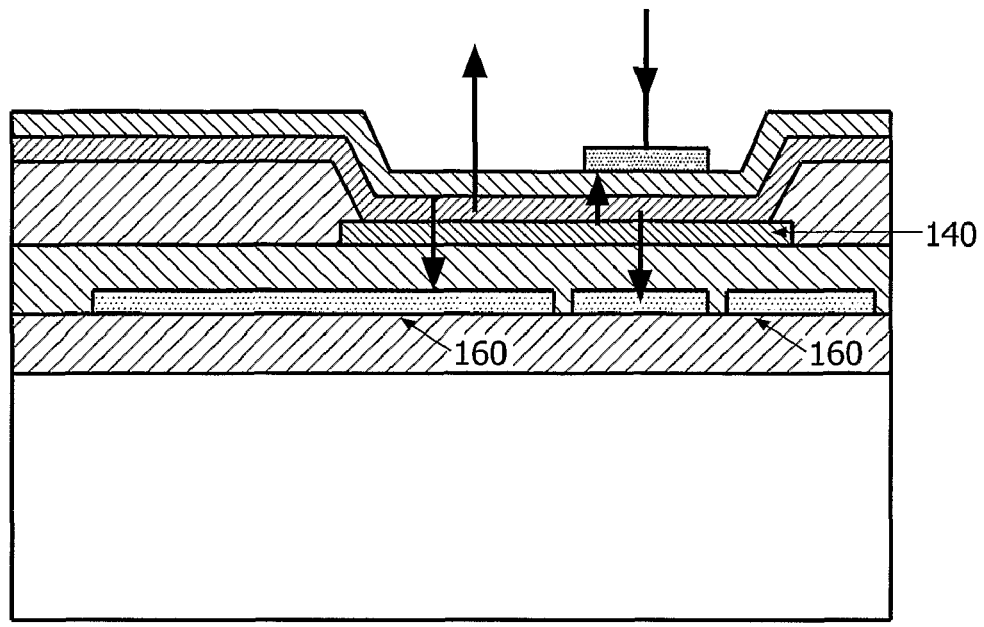
FIG. 17 shows a second top emitting display pixel structure of the invention.

FIG. 17 shows how a ring of diode material 160 is used in combination with a semi-transparent anode 140. This gives the advantage that the optical cavity over the photodiode has the same optical characteristics as the optical cavity over the remainder of the pixel. By providing adbsorption/reflection using the photodiode material for those other areas of the pixel, the portion of the display element output which is sensed by the photodiode is more representative of the display element output. The ring of photodiode material again also performs the function of absorbing shallow angle light to prevent pipelining in the display substrate.

The photodiode may be deposited using layers above the pixel circuits. In this case, the photodiode material can overlie the entire TFT pixel circuit area and thereby act as a light shield to protect the pixel circuit components.

The arrangement of FIG. 17 can also be implemented without the light shield.

Figure 18:
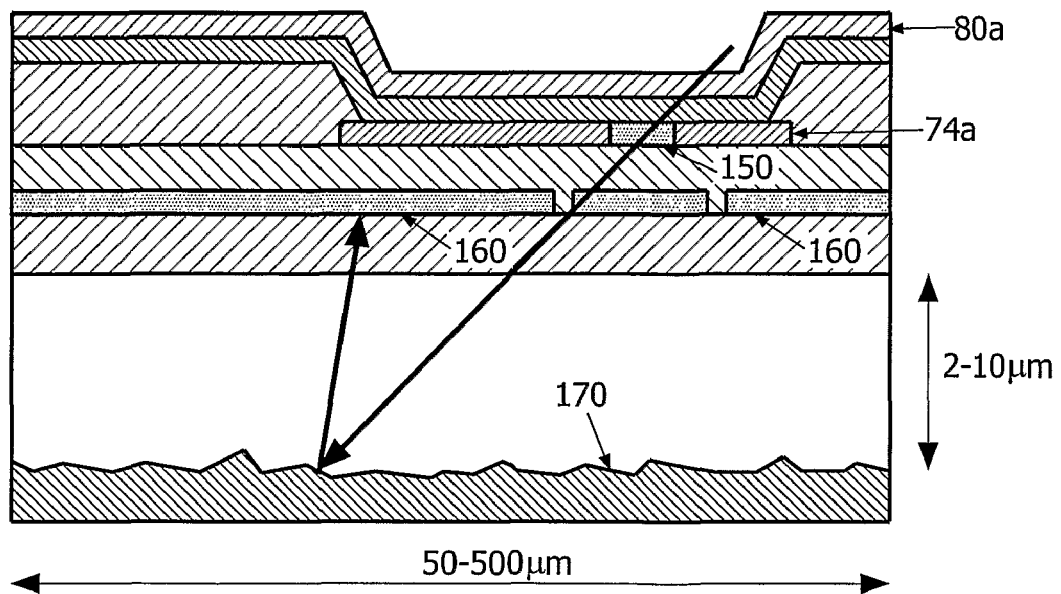
FIG. 18 shows a second top emitting display pixel structure of the invention.

FIG. 18 shows a further approach which may be used alone or in combination with the techniques described above to prevent light being piped long distances in the glass substrate for top emission structures where the substrate does not need to be transparent.

The underlying surface 170 of the glass or insulator is made to be matt black (to absorb light) and/or rough in order to scatter the light into large angles which can pass back out.

The use of a scattering surface is particularly useful with metal foils where a surface texture can easily be applied during substrate polishing. The horizontal and vertical pitch of the roughness should be 0.2-2.0 μm and the optimum angle for scattering is 35-45°.

The light scattered back to steep angles can then be absorbed in a thin film layer (e.g. the photodiode material). Typically, the planarising dielectric (polymer or spin on glass) on the steel is 2-10 μm thick, and the pixel to pixel spacing is 50-500 μm.

A further improvement can be made in the examples above by preventing light entering the photodiode from the side through the design of the photodiode. This can be achieved by coating the photodiode sidewall with a black pigment, and one way to do this is by anisotropic etching.

The layers used in the manufacture of the thin film transistors of each pixel (for example amorphous silicon or low temperature polysilicon layers) are also absorbing, and these layers may also be structured to perform light blocking functions.

The shielding provided by the invention reduces cross talk between light sensors of different pixels. This can also be an advantage for image sensor applications. For example, the light-sensitive elements of the optical feedback pixels can also be controlled to provide an image sensing function in a multifunction display. The light shielding then also improves the image sensing performance. The approach of the invention may also be applied to sold state image sensor devices which have no display functionality.

From reading the present disclosure, other modifications will be apparent to persons skilled in the art.

The invention claimed is:

1. An active matrix display device comprising an array of display pixels, each pixel comprising:
   a current-driven light emitting display element comprising an area of light emitting material (76) sandwiched between electrodes; and
   a drive transistor circuit for driving a current through the display element, the drive transistor circuit comprising a thin film circuit formed on a substrate, the thin film circuit defining a drive transistor and a light-sensitive device for detecting the brightness of the display element, the light-sensitive device having an input surface,
   wherein the drive transistor is controlled in response to the light-sensitive device output and
   wherein each pixel further comprises a light blocking structure formed from existing thin film layers of the structure of the active matrix display device, said thin film layers being comprised of amorphous silicon or low-temperature polysilicon, and
   wherein said light blocking structure is in the proximity of the light-sensitive device (84) and at the level of the input surface for preventing the passage of light to the light-sensitive device from a lateral direction.

2. A device as claimed in claim 1, wherein the light blocking structure comprises a ring surrounding the light-sensitive device.

3. A device as claimed in claim 1, wherein the light blocking structure is formed from one or more of the thin film layers defining the light-sensitive device.

4. A device as claimed in any preceding claim, wherein the light blocking structure is planar.

5. A device as claimed in claim 1, wherein the light blocking structure comprises a side wall extending downwardly from the level of the input surface.

6. A device as claimed in claim 1, wherein the light blocking structure comprises first and second light blocking elements, the first light blocking element being provided at the level of the input surface, and the second light blocking element being provided above the level of the input surface.

7. A device as claimed in claim 6, wherein the first light blocking element is formed from one or more of the thin film layers defining the light-sensitive device, and the second light blocking element is formed from a metal layer which defines the source and drain of the drive transistor.

8. A device as claimed in claim 1, wherein the light-sensitive device is formed beneath the light emitting display element.

9. A device as claimed in claim 8, wherein the electrodes comprise a top reflective electrode and a bottom transparent electrode.

10. A device as claimed in claim 8, wherein the electrodes comprise a top transparent electrode and a bottom electrode which is at least partially reflective.

11. A device as claimed in claim 10, wherein the bottom electrode is fully reflective and comprises an aperture to allow the passage of light through the bottom electrode to the light-sensitive device.

12. A device as claimed in claim 10, wherein the bottom electrode is semitransparent to allow the passage of light through the bottom electrode to the light-sensitive device.

13. A device as claimed in claim 1, wherein the light blocking structure comprises a refractive index cavity formed on top of the input surface of the light-sensitive device.

14. A device as claimed in claim 13, wherein the refractive index cavity comprises an air cavity.

15. A device as claimed in claim 14, wherein the light blocking structure further comprises an air cavity layer formed beneath a bottom surface of the light-sensitive device.

16. A device as claimed in claim 1, wherein the substrate comprises a glass substrate.

17. A device as claimed in claim 10, wherein the substrate comprises a metal foil and insulating dielectric layer.

18. A device as claimed in claim 10, wherein a side of the substrate opposite the thin film circuitry is arranged to disturb reflection of light at the lower surface of the substrate.

19. A device as claimed in claim 18, wherein the side of the substrate opposite the thin film circuitry is arranged to absorb light.

20. A device as claimed in claim 18 wherein the side of the substrate opposite the thin film circuitry is arranged to scatter light.

21. A device as claimed in any preceding claim, wherein the light-dependent device comprises a photodiode.

22. A device as claimed in claim 21 wherein the photodiode comprises a PIN or NIP diode stack or a Schottky diode and top and bottom contact terminals.

23. A device as claimed in claim 1, further comprising a light shield layer at the base of the light-sensitive device.

24. A device as claimed in claim 23 wherein the light shield layer has a footprint larger than the footprint of the light sensitive device.

* * * * *